United States Patent
Cheruiyot et al.

(10) Patent No.: US 9,197,225 B2
(45) Date of Patent: Nov. 24, 2015

(54) CONTROL VOLTAGE MIRROR CIRCUIT

(75) Inventors: Kennedy K. Cheruiyot, Rochester, MN (US); Joel T. Ficke, Bloomer, WI (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 13/253,395

(22) Filed: Oct. 5, 2011

(65) Prior Publication Data

US 2013/0088269 A1   Apr. 11, 2013

(51) Int. Cl.
*G06F 17/50* (2006.01)
*H03L 7/093* (2006.01)

(52) U.S. Cl.
CPC ............ *H03L 7/093* (2013.01); *G06F 17/5063* (2013.01)

(58) Field of Classification Search
None
See application file for complete search history.

(56) References Cited

U.S. PATENT DOCUMENTS

| | | | |
|---|---|---|---|
| 6,275,115 B1 * | 8/2001 | Egawa | 331/11 |
| 6,437,610 B1 * | 8/2002 | Schrodinger | 327/108 |
| 6,661,267 B2 * | 12/2003 | Walker et al. | 327/159 |
| 7,026,879 B2 * | 4/2006 | Booth | 331/17 |
| 7,109,804 B2 | 9/2006 | Mader et al. | |
| 7,446,683 B2 * | 11/2008 | Perner | 341/135 |
| 7,616,501 B2 | 11/2009 | Sporea et al. | |
| 7,629,854 B2 | 12/2009 | Lin et al. | |
| 8,658,959 B2 * | 2/2014 | Gravot | 250/214 DC |
| 2006/0071709 A1 | 4/2006 | Maloberti et al. | |
| 2009/0206676 A1 | 8/2009 | Chu et al. | |
| 2009/0253240 A1 | 10/2009 | Tam et al. | |
| 2009/0302934 A1 | 12/2009 | Costa-Domingues et al. | |
| 2009/0309635 A1 | 12/2009 | Lee | |
| 2011/0240833 A1 * | 10/2011 | Gravot | 250/208.2 |

\* cited by examiner

*Primary Examiner* — A. M. Thompson
(74) *Attorney, Agent, or Firm* — Joan Pennington

(57) ABSTRACT

A circuit for implementing a control voltage mirror is provided. A filter includes a filter capacitor connected to a control voltage and a distal side of the capacitor connected to a voltage reference. The control voltage mirror includes an operational amplifier having a positive input connected to the control voltage, and a negative input is connected to an output and coupled to the distal side of the capacitor. Voltage across the capacitor is held to be near or at zero volts, substantially eliminating capacitor leakage current.

8 Claims, 7 Drawing Sheets

US 9,197,225 B2

CONTROL VOLTAGE MIRROR CIRCUIT

FIELD OF THE INVENTION

The present invention relates generally to the data processing field, and more particularly, relates to a circuit for implementing a control voltage miner mirror for phase error and jitter performance optimization.

DESCRIPTION OF THE RELATED ART

Capacitors are used in many integrated circuits for various applications, such as phase locked loops (PLLs). Various capacitive structures are used as electronic elements in integrated circuits. In some integrated circuit design technologies, thick oxide capacitors are not available. When a PLL loop filter is implemented utilizing a thin oxide capacitor, performance problems result because the thin oxide capacitor has high leakage current. This leakage current causes phase error and jitter.

In the PLL loop filter, significant performance metrics include static phase error and jitter. Static phase error is an average value of a time difference between an arrival time of an input reference clock and a PLL feedback clock at the input of the PLL's phase and frequency detector block after the PLL has achieved lock. Jitter or tracking jitter is the variance between the phases of the input reference clock and a PLL feedback clock. It is desirable to minimize static phase error and jitter.

A need exists for a circuit having an efficient and effective mechanism for minimizing phase error and jitter performance with a filter utilizing a thin oxide capacitor.

SUMMARY OF THE INVENTION

Principal aspects of the present invention are to provide a circuit for implementing a control voltage mirror. Other important aspects of the present invention are to provide such method, circuit and design structure substantially without negative effects and that overcome many of the disadvantages of prior art arrangements.

In brief, a circuit for implementing a control voltage mirror is provided. A filter includes a first filter capacitor connected to a control voltage and a distal side of the capacitor connected to a voltage reference, and a control voltage mirror. The control voltage mirror includes an operational amplifier having a positive input connected to the control voltage, and a negative input is connected to an output and coupled to the distal side of the capacitor. Voltage across the capacitor is held to be near or at zero volts, substantially eliminating capacitor leakage current.

In accordance with features of the invention, the filter is a phase locked loop (PLL) loop filter including a series connected filter capacitor and resistor connected in parallel with the loop filter capacitor.

In accordance with features of the invention, the operational amplifier serves as the virtual ground for the capacitor, the virtual ground being at or near a voltage on the distal side of the capacitor.

In accordance with features of the invention, utilizing a thin oxide capacitor is effectively enabled by the control voltage mirror with DC voltage across the capacitor being held to be near or at zero volts, substantially eliminating current leakage, and reducing static phase error and output jitter.

In accordance with features of the invention, the filter is a loop filter of a phase locked loop (PLL) circuit. The operational amplifier has a substantially lower bandwidth (BW) than the PLL, for example, BW=⅕ PLL BW. The magnitude of the bandwidth ratio of the PLL circuit to the operational amplifier is based upon the required characteristics of the PLL circuit.

In accordance with features of the invention, the loop filter capacitor is a thin oxide capacitor. The distal side of the capacitor is connected to a voltage reference of ground or a power rail. The loop filter capacitor optionally is implemented by a metal-metal (mm) capacitor. The operational amplifier optionally is connected via a synchronous reset switch to the distal side of the capacitor. The operational amplifier optionally is connected directly to the loop filter capacitor without the synchronous reset control signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a circuit for implementing a control voltage mirror, and is provided.

Figure 1:
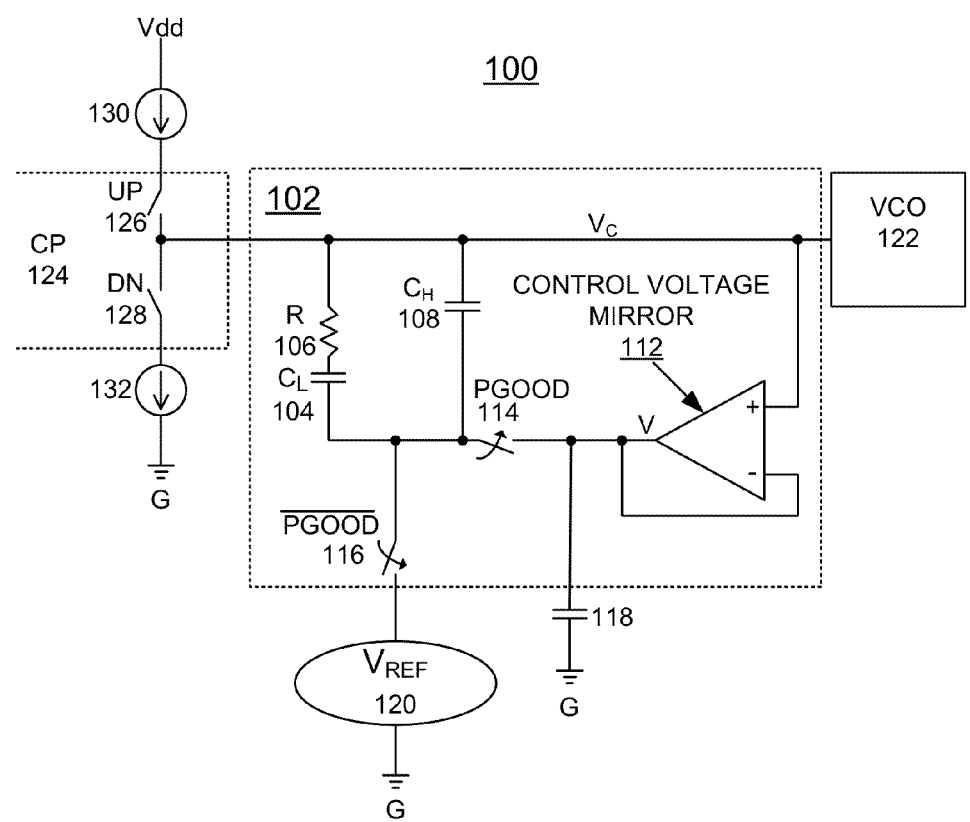
FIG. 1 is a schematic diagram illustrating an example circuit for implementing a control voltage mirror in accordance with a preferred embodiment.

Having reference now to the drawings, in FIG. 1, there is shown an example circuit for implementing a control voltage mirror generally designated by the reference character 100 in accordance with the preferred embodiment. Circuit 100 is implemented with an integrated circuit design technology utilizing thin oxide capacitors where thick oxide capacitors are not available.

In accordance with features of the invention, circuit 100 is implemented such that conventional high leakage current in the thin oxide capacitor is substantially avoided. Conventional phase error and jitter performance problems resulting from high leakage current likewise are avoided.

Circuit 100 includes a filter 102, such as a phase locked loop (PLL) loop filter 102 for a PLL circuit, as illustrated. PLL loop filter 102 includes a first capacitor or loop capacitor $C_L$ 104 in series with a resistor R 106 and a parallel connected loop filter capacitor $C_H$ 108, and a control voltage mirror 112. The first capacitor $C_L$ 104 and the capacitor $C_H$ 108 are on-chip capacitors. The series connected resistor R 106 and capacitor $C_L$ 104 and the parallel connected capacitor $C_H$ 108 are connected to a control voltage $V_{c\ and}$ a distal side of the capacitor are connected to a pair of optional synchronous reset switches 114, PGOOD, and 116, PGOOD_Bar, where PGOOD means power to the system is within specification or good. The 114, PGOOD, and 116, PGOOD_Bar are respectively connected to ground G via a capacitor 118, and to ground G via a voltage reference $V_{REF}$ 120.

The parallel connected capacitor $C_H$ 108 is a small loop filter capacitor, and can be returned to ground or power rail without being connected to the optional respective synchronous reset switches 114, PGOOD_Bar, and 116, PGOOD. The parallel connected small loop filter capacitor $C_H$ 108 and the loop filter capacitor $C_L$ 104 are implemented by thin oxide capacitors. The small loop filter capacitor $C_H$ 108 optionally is implemented by a metal-metal (mm) capacitor. The small loop filter capacitor $C_H$ 108, for example, is 5 pF and the loop filter capacitor $C_L$ 104 is 80 pF.

The control voltage mirror 112 is implemented with an operational amplifier 112 having a positive input connected to the control voltage node $V_c$, and a negative input connected to an output node V and coupled to the distal side of the capacitor $C_H$ 108 via the synchronous reset switches 114. DC voltage across the capacitor $C_H$ 108 and the parallel series connected resistor R 106 and capacitor $C_L$ 104 between the control voltage node $V_c$, and the output node V is held to be near or at zero volts, substantially eliminating capacitor leakage current.

Circuit 100 includes a Voltage Controlled Oscillator (VCO) 122 connected to the control voltage node $V_c$ of the PLL loop filter 102, and a charge pump (CP) 124 having an outputs up clock UP 126 and down clock DN 128 applied to the control voltage node $V_c$ connected to a respective current source 130, 132 respectively connected to a voltage rail Vdd and ground G.

In accordance with features of the invention, the operational amplifier 112 effectively serves as the virtual ground for the capacitor $C_L$ 104 and capacitor $C_H$ 108, the virtual ground being at or near a voltage on the distal side of the capacitor. The operational amplifier 112 is a low-bandwidth amplifier, for example, having a lower bandwidth (BW) than the PLL bandwidth, for example, BW=⅕ PLL BW. The magnitude of the bandwidth ratio of the PLL circuit to the operational amplifier 112 is based upon the required characteristics of the PLL circuit.

In accordance with features of the invention, utilizing a thin oxide capacitor is effectively enabled by the control voltage mirror 112 with the voltage across the capacitor $C_H$ 108 being held to be near or at zero volts, substantially eliminating capacitor charge leakage, and reducing static phase error and output jitter. In the loop filter 102 including the control voltage mirror 112 of the invention, leakage current is substantially less than leakage current in a thin oxide capacitor loop filter without the control voltage mirror 112, such as 7-8 times less leakage current with the loop filter 102 of the invention. For example, the loop filter 102 including the control voltage mirror 112 has a leakage current of about 3 nA/micro-squared or much less as compared to a leakage current of about 20 nA/micro-squared with a thin oxide capacitor loop filter without the control voltage mirror 112.

Figure 2A:
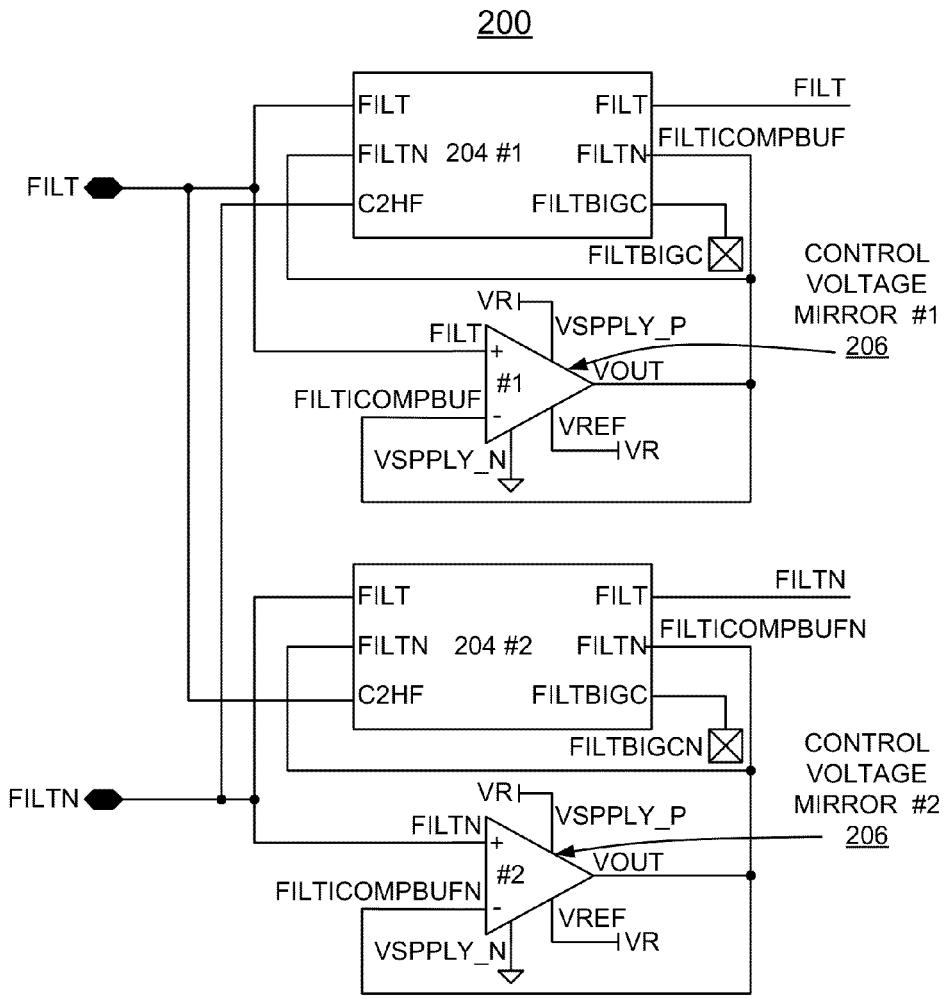
FIGS. 2A and 2B is a schematic diagram illustrating an example differential circuit for implementing a control voltage mirror in accordance with a preferred embodiment.
Figure 2B:
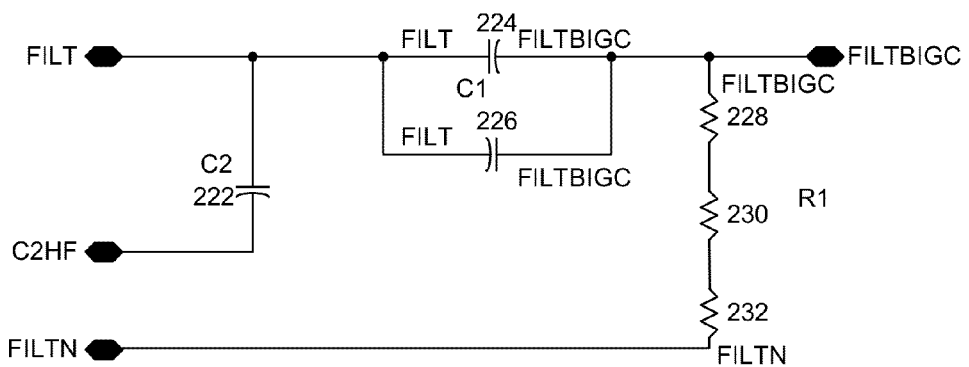

Referring to FIGS. 2A and 2B, there is shown an example differential circuit for implementing a control voltage mirror generally designated by the reference character 200 in accordance with a preferred embodiment. Differential circuit 200 includes similar features and advantages as the circuit 100 of the invention. Circuit 200 is implemented with an integrated circuit design technology utilizing thin oxide capacitors where thick oxide capacitors are not available.

In accordance with features of the invention, circuit 200 is implemented such that conventional high leakage current in the thin oxide capacitor is substantially avoided. Conventional phase error and jitter performance problems resulting from high leakage current likewise are avoided.

Differential circuit 200 includes a pair of phase locked loop (PLL) loop filters 204 #1, #2 including a respective control voltage mirror 206, #1, #2. The respective control voltage mirror 206, #1, #2 receiving differential filter voltages FILT and FILTN is implemented by a respective operational amplifier 206, #1, #2 connected between respective voltage rails VSPPLY_P, VSPPLY_P, and a voltage reference VREF. The respective operational amplifier 206, #1, #2 have a positive input respectively connected to the respective filter voltage FILT, FILTN and a negative input respectively connected to the output VOUT, and respective filter voltages FILTN, FILT, which are respectively connected to the filter node C2HF, and respectively connected to respective filter nodes FILTICOMPBUF, FILTICOMPBUFN.

Referring to FIG. 2B, each of the PLL loop filters 204 #1, #2 include a first capacitor C1 in series with a resistor R1 and a parallel connected capacitor C2 222. The first capacitor C1 includes a pair of parallel connected capacitors 224, 226 connected between the filter voltage FILT, and filter input FILTBIGC. The resistor R1 includes a plurality of series connected resistors 228, 230, 232 connected between filter input FILTBIGC and the filter voltage FILTN. The first capacitor C1, 224, 226 and the parallel connected capacitor C2 222 are on-chip, thin oxide capacitors. The respective capacitor C1, 224, 226, and capacitor C2 222 for example, are optionally implemented metal-metal (mm) capacitors.

In accordance with features of the invention, the operational amplifiers 206, #1, #2 define the respective control voltage mirrors 206, #1, #2. Voltage across capacitor C2 222 and the parallel connected capacitor C1 in series with a resistor R1 between the respective filter voltage FILT, FILTN, and the respective output node FILTICOMPBUF, FILTICOMPBUFN is held to be near or at zero volts, substantially eliminating capacitor leakage current. In FIGS. 2A and 2B, capacitor C2 222 advantageously is implemented by a metal-insulator-metal (MIM) capacitor, as the value and physical area is much smaller. This allows the loop filter 200 to have a differential capacitor component, enabling use in applications where a differential loop filter is required.

Figure 3:
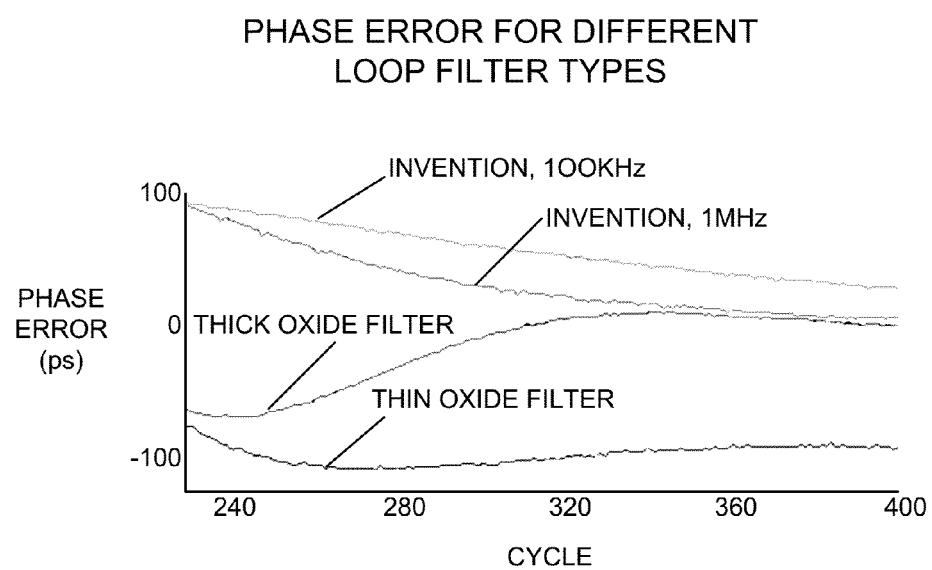
FIGS. 3, 4 and 5 are example waveforms illustrating example operation of PLL loop filters with the control voltage mirror in accordance with the preferred embodiment.
Figure 4:
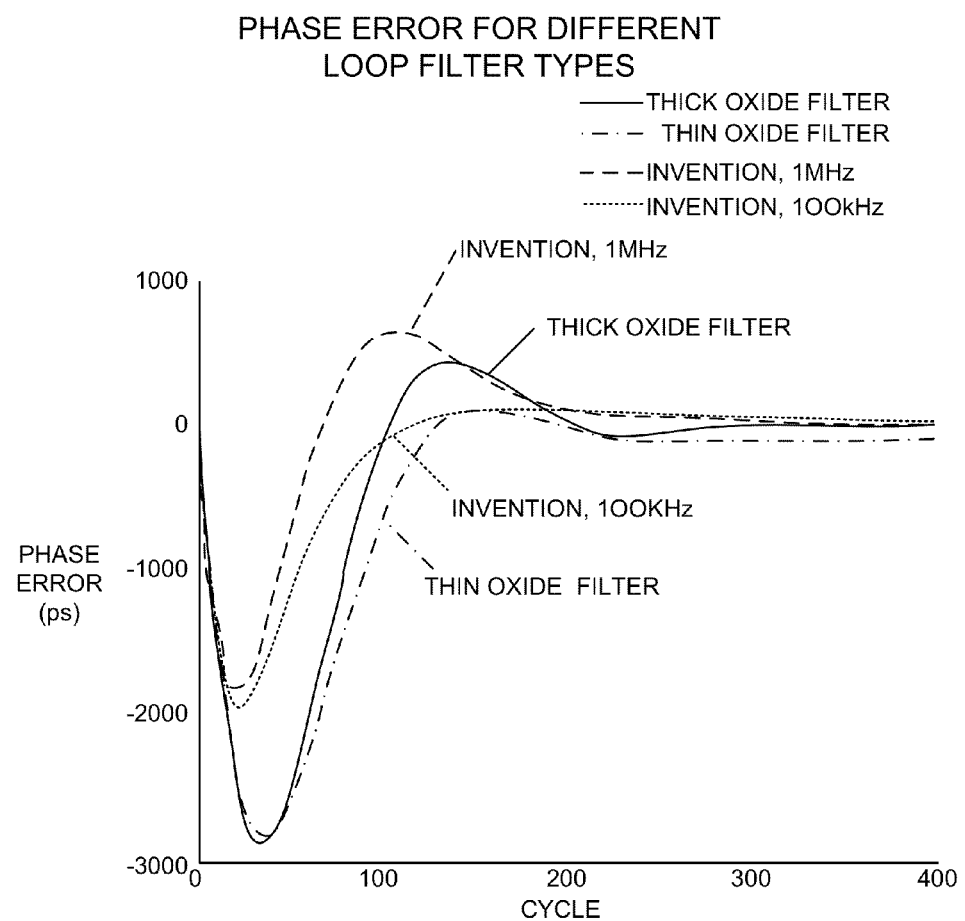
Figure 5:
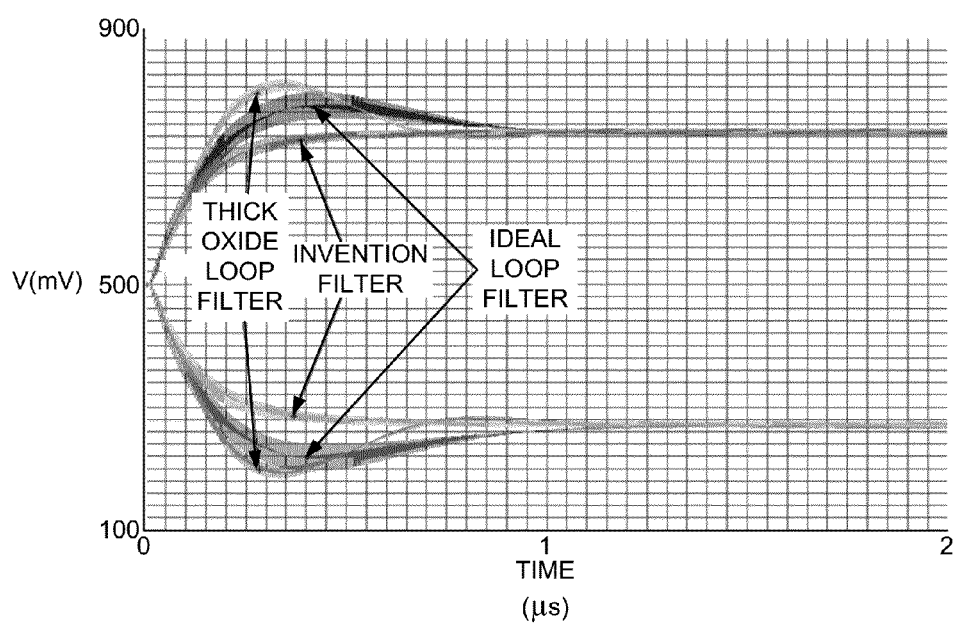

Referring to FIGS. 3, 4, and 5, there are shown example waveforms illustrating example operation of PLL loop filters of the circuit 100, 200 for comparison with other PLL loop filter types including a thick oxide capacitor PLL loop filter and a thin oxide capacitor PLL loop filter.

In FIGS. 3 and 4, waveforms for PLL loop filter 102 of circuit 100, and PLL loop filters 204, 206 of circuit 200 are indicated by respective labels INVENTION, 100 KHz, and INVENTION, 1 MHz, where 100 KHz and 1 MHz refers to the operational amplifier bandwidth, with phase error (ps) is illustrated with respect to the vertical axis and cycle illustrated with respect to the horizontal axis. A respective waveform for operation of a conventional thick oxide PLL loop filter is indicated by the label THICK OXIDE FILTER and for operation of a thin oxide PLL loop filter is indicated by the label THIN OXIDE FILTER.

As illustrated in FIGS. 3 and 4, in operation of the PLL loop filter 102 of circuit 100, and PLL loop filters 204, 206 of circuit 200, the waveforms INVENTION, 100 KHz, and INVENTION, 1 MHz approach zero 0 or are 0 phase error (ps) for the invention.

In FIG. 5, enhanced operation for PLL loop filter 102 of circuit 100 and PLL loop filters 204, 206 of circuit 200 is illustrated by waveforms indicated by the label INVENTION FILTER with voltage (mV) illustrated with respect to the vertical axis and time (µs) illustrated with respect to the horizontal axis. Respective waveforms provided for comparison illustrate operation of a conventional thick oxide PLL loop filter indicated by the label EG LOOP FILTER and illustrate operation of an ideal loop filter indicated by the label IDEAL LOOP FILTER.

Figure 6:
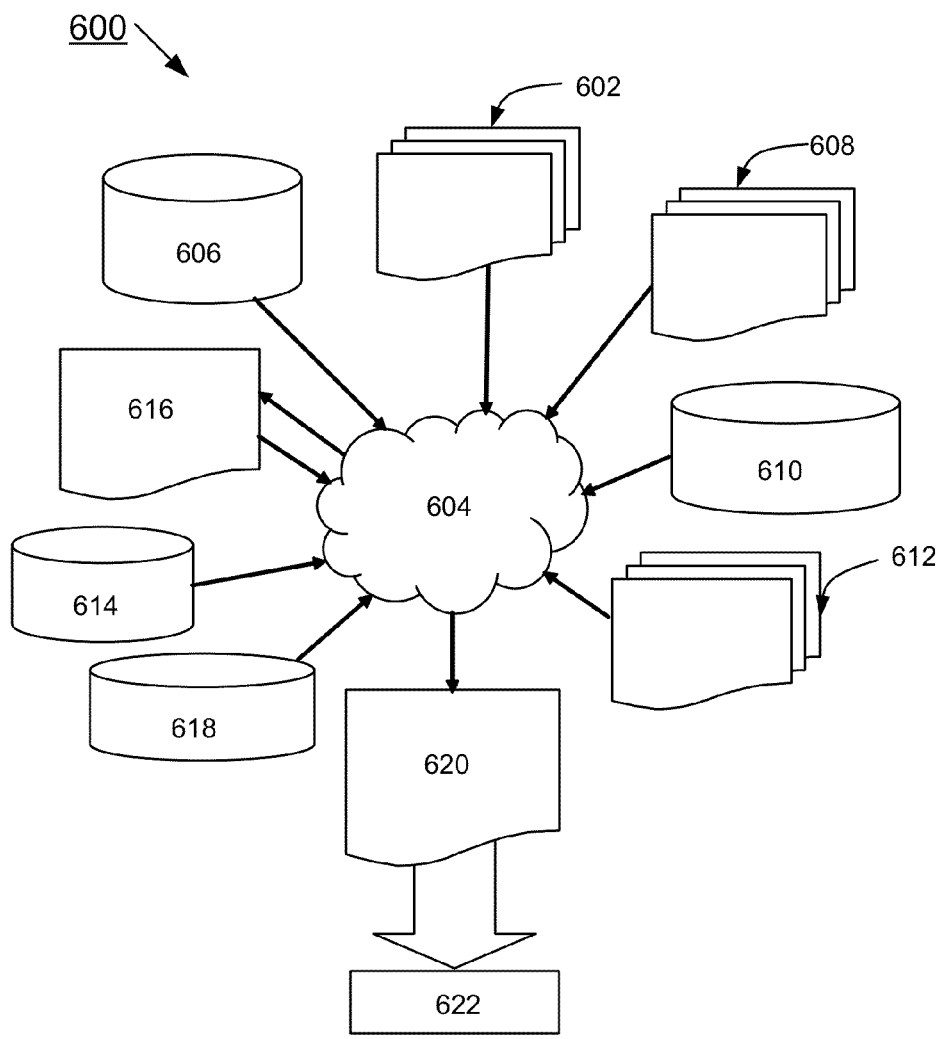
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 100, 200 in the form of schematics or HDL, a hardware-description language, for example, Verilog, VHDL, C, and the like. Design structure 602 may be contained on one or more machine readable medium. For example, design structure 602 may be a text file or a graphical representation of circuits 100, 200. Design process 604 preferably synthesizes, or translates, circuit 100 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuits.

Design process 604 may include using a variety of inputs; for example, inputs from library elements 608 which may house a set of commonly used elements, circuits, and devices, including models, layouts, and symbolic representations, for a given manufacturing technology, such as different technology nodes, 3 nm, 45 nm, 90 nm, and the like, design specifications 610, characterization data 612, verification data 614, design rules 616, and test data files 616, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 1, 2A, and 2B along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, and 2B. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A control voltage mirror comprising:
    a phase locked loop filter including a first thin oxide capacitor;
    said first thin oxide capacitor having a first side connected to a control voltage and a distal side of said first thin oxide capacitor coupled to a voltage reference; and
    an operational amplifier having a positive input connected to said control voltage and said first side of said first thin oxide capacitor, and having a negative input connected to an output of said operational amplifier and said distal side of said first thin oxide capacitor, said output of said operational amplifier substantially equal to said control voltage; said output of said operational amplifier holding a DC voltage potential across said first thin oxide capacitor at or near zero volts, providing enhanced capacitor leakage current, and phase error and jitter performance.

2. The control voltage mirror as recited in claim 1, wherein said operational amplifier has a lower bandwidth (BW) than a bandwidth of said phase locked loop (PLL) loop filter.

3. The control voltage mirror as recited in claim 2, wherein said operational amplifier has a bandwidth (BW) of less than ⅕ of said bandwidth of said PLL loop filter.

4. The control voltage mirror as recited in claim 1, wherein said phase locked loop (PLL) loop filter includes a series connected filter capacitor and resistor connected in parallel with said first thin oxide capacitor.

5. The control voltage mirror as recited in claim 4, wherein said series connected filter capacitor is a thin oxide capacitor.

6. The control voltage mirror as recited in claim 4, wherein said first thin oxide capacitor is implemented by a metal-metal (mm) capacitor.

7. The control voltage mirror as recited in claim 4, wherein said PLL loop filter is a differential loop filter.

8. The control voltage mirror as recited in claim 7, wherein said first thin oxide capacitor is a metal-insulator-metal (MIM) capacitor.

* * * * *